(12) United States Patent
Schumacher et al.

(10) Patent No.: US 10,747,259 B2
(45) Date of Patent: Aug. 18, 2020

(54) MULTICHIP REFERENCE LOGGING SYNCHRONIZATION

(71) Applicant: Intel IP Corporation, Santa Clara, CA (US)

(72) Inventors: Uwe Schumacher, Malsch (DE); Peter Lachner, Heroldstatt (DE); Andrej Tkalcec, Karlsruhe (DE); Donald Korinke, Vancouver, WA (US)

(73) Assignee: Intel IP Corporation, Santa Clara, CA (US)

( * ) Notice: Subject to any disclaimer, the term of this patent is extended or adjusted under 35 U.S.C. 154(b) by 158 days.

(21) Appl. No.: 15/857,706

(22) Filed: Dec. 29, 2017

(65) Prior Publication Data

US 2019/0050021 A1 Feb. 14, 2019

(51) Int. Cl.
| | |
|---|---|
| *G06F 11/273* | (2006.01) |
| *G06F 1/12* | (2006.01) |
| *G06F 11/36* | (2006.01) |
| *G01R 31/317* | (2006.01) |
| *G06F 11/34* | (2006.01) |

(52) U.S. Cl.
CPC .......... *G06F 1/12* (2013.01); *G01R 31/31726* (2013.01); *G06F 11/3636* (2013.01); *G06F 11/3476* (2013.01); *G06F 11/3648* (2013.01); *G06F 2201/86* (2013.01)

(58) Field of Classification Search
CPC .......................... G06F 11/0724; G06F 11/3476
USPC ...................................................... 714/37, 51
See application file for complete search history.

(56) References Cited

U.S. PATENT DOCUMENTS

| | | | | |
|---|---|---|---|---|
| 9,590,636 | B1* | 3/2017 | McKinley | ........ H03K 19/17768 |
| 2007/0220456 | A1* | 9/2007 | Duan | ............... G01R 31/31723 |
| | | | | 716/136 |
| 2008/0215923 | A1* | 9/2008 | Bueti | .................. G06F 17/5022 |
| | | | | 714/39 |
| 2012/0150474 | A1* | 6/2012 | Rentschler | ....... G01R 31/31705 |
| | | | | 702/117 |
| 2012/0226839 | A1* | 9/2012 | Fuoco | .................. G06F 11/3636 |
| | | | | 710/110 |
| 2013/0166791 | A1* | 6/2013 | Kobayashi | .......... G06F 11/3051 |
| | | | | 710/19 |
| 2014/0081509 | A1* | 3/2014 | Koch | ................... G07C 5/0808 |
| | | | | 701/29.2 |

(Continued)

*Primary Examiner* — Chae M Ko
(74) *Attorney, Agent, or Firm* — Viering, Jentschura & Partner mbB

(57) ABSTRACT

Herein is disclosed a multichip reference logging system comprising a control circuit, configured to generate a reference signal; a first chip, configured to generate a first operations log, the first chip further comprising a first reference circuit, configured to receive the reference signal and to create a first reference event in response to the received reference signal; a memory associated with the first chip, configured to store the first reference event within the first operations log; a second chip, configured to generate a second operations log, the second chip further comprising a second reference circuit, configured to receive the reference signal and to create a second reference event in response to the received reference signal; and a memory associated with the second chip, configured to store the second reference event within the second operations log.

20 Claims, 4 Drawing Sheets

(56) References Cited

U.S. PATENT DOCUMENTS

| | | | | |
|---|---|---|---|---|
| 2014/0380020 A1* | 12/2014 | Gray | ......................... | G06F 9/52 |
| | | | | 712/203 |
| 2015/0074255 A1* | 3/2015 | Davis | ...................... | H04L 45/60 |
| | | | | 709/223 |
| 2016/0187464 A1* | 6/2016 | Ginsburg | .............. | G01S 7/4008 |
| | | | | 342/168 |
| 2016/0350657 A1* | 12/2016 | Gupta | ................. | G06F 11/3604 |
| 2017/0090014 A1* | 3/2017 | Subburaj | ............... | G01S 7/4004 |

\* cited by examiner

| Trace Log One | | Trace Log Two | |
|---|---|---|---|
| Log Entry | 000001 | Log Entry | 000001 |
| Log Entry | 000002 | Log Entry | 000002 |
| Log Entry | 000003 | Log Entry | 000003 |
| Log Entry | 000004 | Log Entry | 000004 |
| Log Entry | 000005 | Log Entry | 000005 |
| Log Entry | 000006 | Log Entry | 000006 |
| 301 REFERENCE ENTRY 1 | 000007 | Log Entry | 000007 |
| Log Entry | 000008 | Log Entry | 000008 |
| 305 REFERENCE COUNTER 1 | 000009 | Log Entry | 000009 |
| Log Entry | 000010 | Log Entry | 000010 |
| Log Entry | 000011 | 302 REFERENCE ENTRY 1 | 000011 |
| Log Entry | 000012 | Log Entry | 000012 |
| Log Entry | 000013 | 306 REFERENCE COUNTER 1 | 000013 |
| Log Entry | 000014 | Log Entry | 000014 |
| 303 REFERENCE ENTRY 2 | 000015 | Log Entry | 000015 |
| Log Entry | 000016 | REFERENCE ENTRY 2 | 000016 |
| Log Entry | 000017 | Log Entry | 000017 |
| 307 REFERENCE COUNTER 2 | 000018 | 304 Log Entry | 000018 |
| Log Entry | 000019 | Log Entry | 000019 |
| REFERENCE ENTRY 3 | 000020 | 308 REFERENCE COUNTER 2 | 000020 |
| Log Entry | 000021 | Log Entry | 000021 |
| REFERENCE COUNTER 3 | 000022 | Log Entry | 000022 |
| Log Entry | 000023 | Log Entry | 000023 |
| Log Entry | 000024 | REFERENCE ENTRY 3 | 000024 |
| Log Entry | 000025 | Log Entry | 000025 |
| Log Entry | 000026 | Log Entry | 000026 |
| Log Entry | 000027 | Log Entry | 000027 |
| Log Entry | 000028 | REFERENCE COUNTER 3 | 000028 |
| Log Entry | 000029 | Log Entry | 000029 |
| Log Entry | 000030 | Log Entry | 000030 |
| Log Entry | 000031 | Log Entry | 000031 |
| Log Entry | 000032 | Log Entry | 000032 |

MULTICHIP REFERENCE LOGGING SYNCHRONIZATION

TECHNICAL FIELD

Various aspects of the disclosure relate generally to the synchronization of multiple heterogeneous circuits for debugging.

BACKGROUND

Advanced Driver Assistance Systems ("ADAS") are systems to automate or improve portions of the driving experience. It is known to create redundant and independent ADAS systems within a motor vehicle. These ADAS systems may be controlled and/or monitored by a security controller. Where one of the independent ADAS systems generates an error, the security controller may reach certain corresponding security decisions.

To understand and improve the ADAS systems, it is necessary to collect and analyze processor operation tracing information from the redundant and independent ADAS chips for debugging on a tracing host. Debugging requires correlation of traces from redundant systems. Because each system has its own oscillator with an individual start up time, individual frequencies, and/or temperature, the systems are not synchronous, and therefore it can be difficult to correlate the tracing entries for debugging.

SUMMARY

Herein is disclosed a multichip reference logging system comprising a control circuit, configured to generate a reference signal; a first chip, configured to generate a first operations log, the first chip further comprising a first reference circuit, configured to receive the reference signal and to create a first reference event in response to the received reference signal; a memory associated with the first chip, configured to store the first reference event within the first operations log; a second chip, configured to generate a second operations log, the second chip further comprising a second reference circuit, configured to receive the reference signal and to create a second reference event in response to the received reference signal; and a memory associated with the second chip, configured to store the second reference event within the second operations log.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which:

FIG. 3 shows an Advanced Driver Assistance System Logging Synchronization System according to another aspect of the disclosure;

DESCRIPTION

Figure 1:
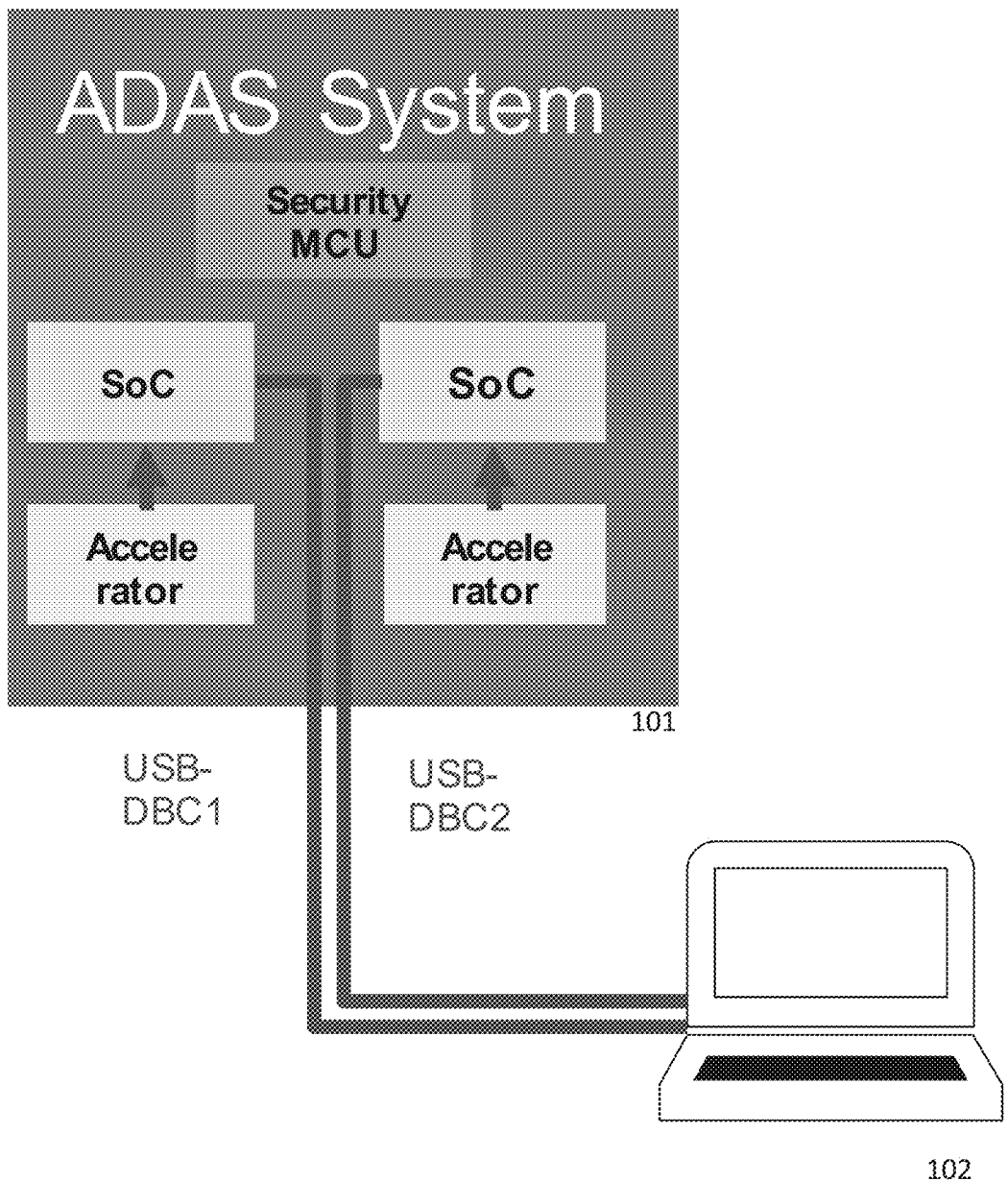
FIG. 1 shows an Advanced Driver Assistance System Logging Synchronization System according to an aspect of the disclosure.

The following detailed description refers to the accompanying drawings that show, by way of illustration, specific details and aspects in which the disclosure may be practiced. These aspects are described in sufficient detail to enable those skilled in the art to practice the disclosure. Other aspects may be utilized and structural, logical, and electrical changes may be made without departing from the scope of the disclosure. The various aspects are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The word "exemplary" is used herein to mean "serving as an example, instance, or illustration." Any aspect of the disclosure described herein as "exemplary" is not necessarily to be construed as preferred or advantageous over other aspects of the disclosure.

Throughout the drawings, it should be noted that like reference numbers are used to depict the same or similar elements, features, and structures.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more. The terms "proper subset", "reduced subset", and "lesser subset" refer to a subset of a set that is not equal to the set, i.e. a subset of a set that contains less elements than the set.

The term "processor" or "controller" as, for example, used herein may be understood as any kind of entity that allows handling data, signals, etc. The data, signals, etc. may be handled according to one or more specific functions executed by the processor or controller.

A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "system" (e.g., a drive system, a position detection system, etc.) detailed herein may be understood as a set of interacting elements, the elements may be, by way of example and not of limitation, one or more mechanical components, one or more electrical components, one or more instructions (e.g., encoded in storage media), one or more controllers, etc.

A "circuit" as user herein is understood as any kind of logic-implementing entity, which may include special-purpose hardware or a processor executing software. A circuit may thus be an analog circuit, digital circuit, mixed-signal circuit, logic circuit, processor, microprocessor, Central Processing Unit ("CPU"), Graphics Processing Unit ("GPU"), Digital Signal Processor ("DSP"), Field Programmable Gate Array ("FPGA"), integrated circuit, Application Specific Integrated Circuit ("ASIC"), etc., or any combination thereof. Any other kind of implementation of the respective functions which will be described below in further detail may also be understood as a "circuit." It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit.

FIG. 1 shows a conventional ADAS system 101 according to one aspect of the disclosure. In the ADAS system, redundant SOC and accelerator couples operate independently to perform ADAS system calculations. The two SOC and accelerator couples, although operating independently, are controlled and monitored by a security controller, depicted as the security microcontroller unit (MCU). Each SOC and accelerator couple is electrically independent. Each SOC and accelerator couple includes its own oscillator, with an individual startup time, individual frequencies, individual drift due to temperature, and etc. Thus, even where the SOC and accelerator couples are initiated simultaneously, it is anticipated that they will drift or otherwise provide asynchronous tracing log results.

Figure 2:
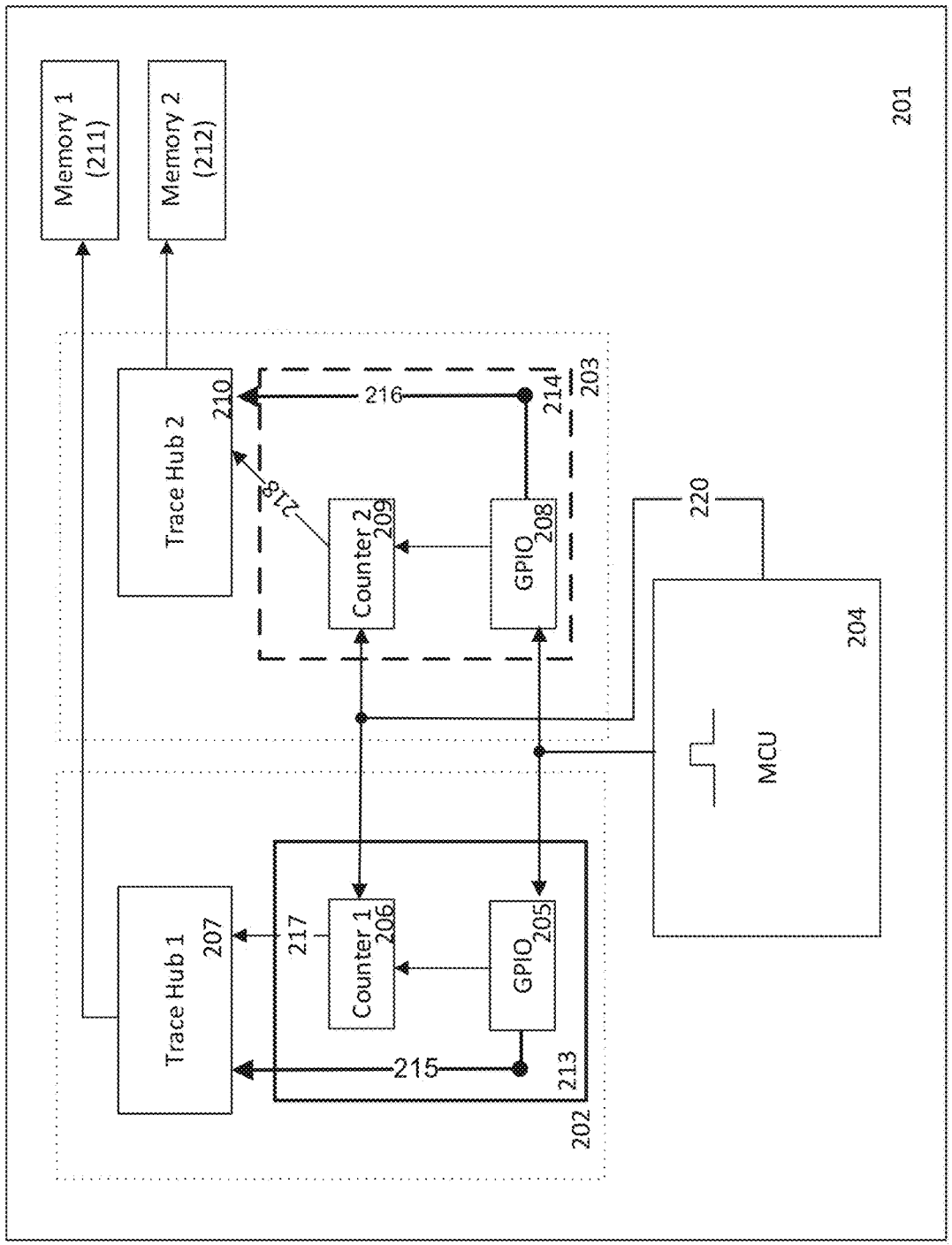
FIG. 2 shows a dual trace hub log with a synchronous logging entries.

FIG. 2 shows an Advanced Driver Assistance System Logging Synchronization System 201 according to an aspect of the disclosure. Motor vehicle data is obtained and logged by two asynchronous system on Chip (SOC) modules, 202 and 203. The creation of synchronous logging entries is controlled by the MCU 204, which is connected to the first SOC 202 and the second SOC 203. The first SOC module 202 includes an input/output region, which may be configured as a general-purpose input output (GIPO), 205, configured to connect a reference circuit 213 with the MCU. A first reference circuit 213, which is configured to generate reference output 215 and 217 upon receipt of a signal from the MCU 204, is connected to the MCU 204 through the GPIO 205. GPIO 205 is also connected directly to Trace Hub 1 (207) over an internal signal 215, which creates a reference entry into Trace Hub on GPIO status (pin level) change. A first reference circuit 213 is connected to Trace Hub 1 module 207, which generates an incremental counter value (reference counter signal 217) and a reference entry signal 215, both transmitted to Trace Hub 1 207 for log entry correlation, later used to download the log for debugging.

The second SOC 203 has a second reference circuit 214, which is configured to generate reference output 216 and 218 upon receipt of a signal from the MCU 204, connected to the MCU 204 through the GPIO 208. GPIO 208 is also connected directly to Trace Hub 2 (210) over an internal signal 216, which creates a reference entry into Trace Hub on GPIO status (pin level) change. The second reference circuit 214 is connected to Trace Hub 2 module 210, which generates an incremental counter value (reference counter signal 218) and a reference entry signal 216, both transmitted to Trace Hub 2 210 for log entry correlation, later used to download the log for debugging. At a predetermined frequency, the MCU 204 will emit a reference signal designed to trigger reference circuit events. The signal travels to the respective reference circuits, reference circuit one 213 and reference circuit two 214. Each reference circuit, upon receiving the signal from the MCU 204 may be caused to increase a count. The increase of count is sent to the respective trace hubs, trace hub one 207 and trace hub to 210, where the reference circuit output is recorded as a trace event. Furthermore, counter 206 and counter 209 may be reset by a reset signal 220 from MCU 204 at some time to define a starting point for the reference circuits and trace hub log correlation. The trace events from the first SOC 202 may be stored in memory 211 and the trace events from a second SOC 203 may be stored in memory 212. In FIG. 2, the memories are depicted as being external to the first SOC 202 and the second SOC 203; however, the memories may be located on the SOCs, outside of the SOC's but within the ADAS 201, or otherwise.

FIG. 3 shows a sample downloaded trace hub register, comprising entries from a first trace log and a second trace log. This figure includes four vertical columns, the first two vertical columns corresponding to trace hub one 207 and the second two vertical columns corresponding to trace hub two 210. For each trace hub, the first vertical column contains a list of trace log entries (shown generically as "log entry" for simplicity); the second vertical column shows a time stamp (shown generically as a numerical increment of one). It is expressly recognized that a time stamp may be a variety of formats and may be tied directly to hours, minutes, seconds, and/or fractions thereof. Because SOC one 202 and SOC two 203 operate independently of one another and are asynchronous, it is anticipated that any timestamps or chronological indications in such a conventional entry may not correspond to one another.

FIG. 3 includes four entries 301, 302, 303, and 304, which are reference entries and correspond to the reference circuitry 213 and 214, as provided by signals 215 and 216 due to status changes upon receipt of a signal by MCU 204. FIG. 3 also includes four entries 305, 306, 307 and 308, which are numeric entries and correspond to reference circuit events from the first reference circuit 213 by signal 217 and the second reference circuit 214 by signal 218. Entries 301, 302, 303 and 304 are hardware-generated entries that are created immediately without time delay. Entries 305, 306, 307 and 308 are reference counters and can be generated with time delay but must be received and stored in the log before the MCU 204 triggers the next events. Entries 305, 306, 307 and 308 are used to correlate the corresponding reference entries. That is to say, upon receiving the MCU signal, each reference circuit 213 and 214 may create a reference circuit output (a reference circuit event), which is recorded as a trace event by the respective trace hubs. The reference circuit event for reference circuit one is recorded as a line-entry within trace log one, and the reference circuit event for reference circuit two is recorded as a line event for trace log two. The reference circuits may be matched or synchronized, such that the resulting reference circuit events correspond to one another. This is displayed in a simplified manner in FIG. 3, wherein reference entry 1 from the first reference circuit is depicted as 301 at timestamp 000007. Corresponding reference entry 1 from the second reference circuit is depicted as 302 at timestamp 000011. The attribution of discordant timestamp entries to the simultaneously created reference entries renders comparison of like entries in a debugging exercise challenging. Nevertheless, because of the corresponding reference circuit entries, a debugging program can be caused to match the reference circuit entries and thereby allow for ease of comparison of debugging entries. Moreover, the debugging program can correlate timestamp 000007 in trace log one with timestamp 000011 in trace log two with the help of the reference counters, thereby simplifying correlation of nearly trace log entries. In a similar fashion, Reference Entry 2 is depicted from the first reference circuit as 303 at timestamp 000015 and from the second reference circuit as 304 at timestamp 000016. A debugging program may be configured to locate these entries within the two trace hub logs; to correlate timestamp 000015 in trace log one with timestamp 000016 in trace log two; and to correlate the surrounding entries based on a matching counter entry.

Figure 4:
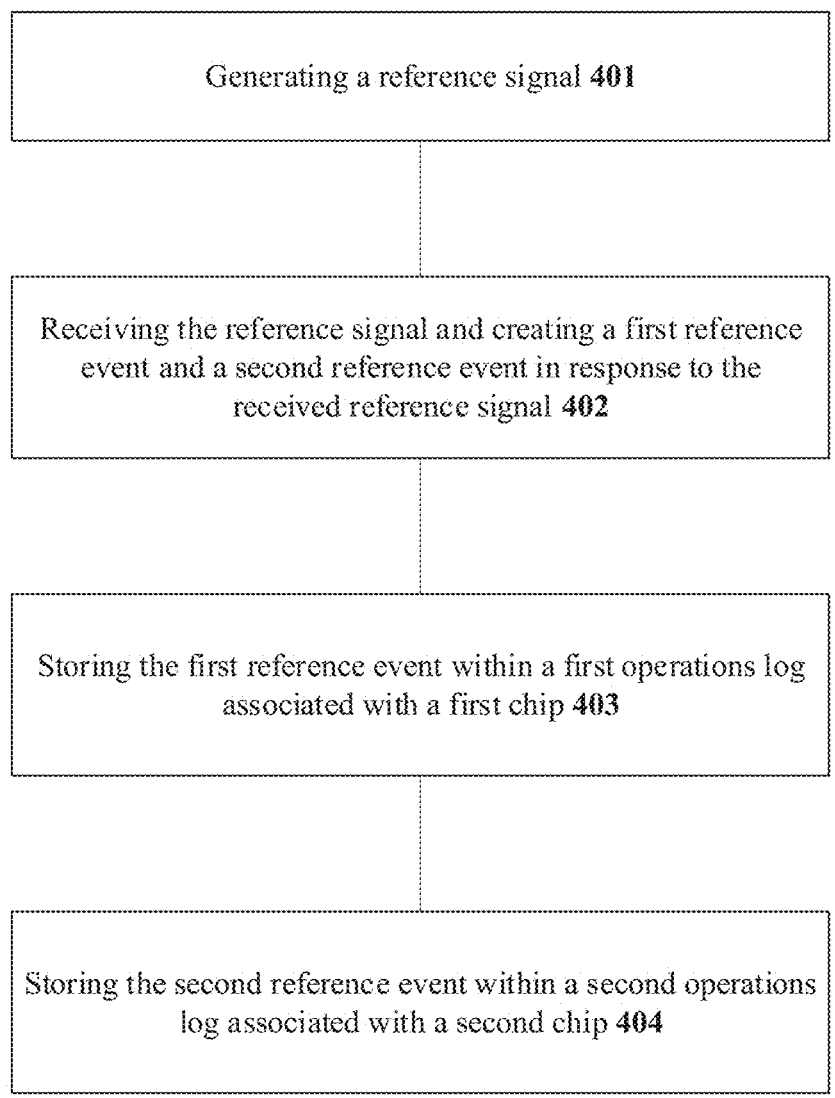
FIG. 4 shows a method of Advanced Driver Assistance System Logging according to an aspect of the disclosure.

FIG. 4 shows a method of multichip reference logging comprising generating a reference signal 401; receiving the reference signal and creating a first reference event and a second reference event in response to the received reference signal 402; storing the first reference event within a first operations log associated with a first chip 403; and storing the second reference event within a second operations log associated with a second chip 404.

According to one aspect of the disclosure, the MCU may be described as a control circuit, which is configured to generate a reference signal. The reference signal may be any signal, without limitation, that causes a reference circuit to create a reference event. The control circuit is connected to a first chip and a second chip, each chip being configured to generate an operations log. The first chip includes a first reference circuit and a memory. The first reference circuit is configured to receive the reference signal from the control circuit and to create a first reference event in response to the received reference signal. The first chip further includes a memory, which is configured to store the first reference event within a first operations log. The second chip includes a second reference circuit, which is configured to receive the reference signal and to create a second reference event in response to the received reference signal. The second chip further includes a memory, which is configured to store the second reference event within a second operations log.

Each SOC may include at least one input/output port. The input/output port may be a GPIO port, or any other input/output port capable of connecting a reference circuit to the MCU. The input/output port may alternatively be a hardwired port, rather than an adaptable port, such that the counter is hardwired on the SOC to be connected to the MCU. Under this configuration, there may exist a permanent connection between the reference circuit and the MCU, and/or the reference circuit may be installed by the manufacture to be connected to the MCU. It is anticipated that the SOC's input/output region, whether an adaptable port or a hardwired connection, is a means to connect the counter to the MCU and should not be understood to be limited in terms of an adaptable connection, a permanent connection, or otherwise.

Each SOC is configured to include information from the input/output port within its operation log. As described herein, each SOC is configured to create an operation log, which is prepared for contemporaneous downloading or stored for later downloading in a debugging process. The operation log may include a variety of entries, including, but not limited to logical operations, errors, input/output entries, or otherwise. It is anticipated that the reference signal from the MCU will cause a reference circuit to generate a reference event that will be entered into the operation log. The MCU reference signal itself may be included within the operation log, depending on preferences of the installation. A function of the input/output region is to create an electrical connection between the first reference circuit or the second reference circuit and the MCU.

Each SOC includes a reference circuit, described herein as a first reference circuit for the first SOC and a second reference circuit for the second SOC. The term "reference circuit" is used herein in a general sense and may refer to a variety of reference circuits, including, but not limited to, a counter, one or more shift registers, one or more flip flops, or otherwise. The reference circuit may be hardware or software. The reference circuit may create an entry to be included within the operations log upon receiving a signal from the MCU.

Where the reference circuit is configured as a reference signal event and reference counter, the reference circuit may create a sequential reference event in response to a reference signal. This may assist in entry ordering and/or cross-referencing during a debugging process. The reference circuits may be matched, such that identical, or nearly identical, sequential entries are created from the first reference circuit and the second reference circuit in response to the MCU. This may occur such reference circuit one and reference circuit two simultaneously or nearly simultaneously receive a reference signal from the MCU at time zero $t_0$. In response, reference circuit one creates reference entry one $re_1$, and reference circuit two creates reference entry two $re_2$. Both $re_1$ and $re_2$ are logged within their respective trace logs. Because the SOCs operate asynchronously, the reference entries will be assigned different timestamps, such that $re_1$ is assigned timestamp one $ts_1$ and $re_2$ is assigned timestamp two $ts_2$. Because $ts_1$ and $ts_2$ occurred at the same time, the host can correlate the timestamps with $t_0$, at which the synchronous event occurred. By coordinating the timestamps with a synchronous event, the reference events become an anchor point to correlate entries from redundant trace logs. Where two simultaneous trace log entries with non-corresponding time stamps may be correlated, the surrounding entries may also be more easily correlated for debugging purposes. The sequential nature of the reference circuit entries simplifies correlation. Thus, the first reference event and the second reference event may be corresponding or identical counter numbers created in response to a synchronously received impulse or signal. The counter output may be configured in any manner desirable, whether in numbers sequentially increased by one or any other number, by hexadecimal number, or in any other numbering format capable of producing a sequential output.

Alternatively, the reference circuit may provide an entry that is not sequential, but rather is a repeated, static entry, or an injury that repeats from a limited set. Where the reference circuits do not create matched sequential entries, the reference circuits may create identical or similar non-sequential entries, such that the entries may be matched or cross-referenced in a debugging process. Non-sequential reference circuit entries permit correlation at least by counting a number of reference circuit entries on each log and matching them together. For example a first reference entry on trace log one may be matched to a first reference entry on trace log two; a second reference entry on trace log one may be matched to a second reference entry on trace log two, and so on. This may occur, for example, where the reference circuit output is not sequential, regardless of whether the reference circuit output of the two reference circuits is static or dynamic.

The MCU may be configured to simultaneously deliver a reference signal to the first reference circuit and the second reference circuit. Whether directly or through the input/output port, the MCU may have a wired connection to the first reference circuit and the second reference circuit. Such a wired connection, as opposed to a wireless connection, may allow for a more consistent delivery of the reference signal, such that a transmission time of a reference signal from the MCU to the first reference circuit and second reference circuit is approximately the same time for each reference signal. The electrical path from the MCU to the first reference circuit and second reference circuit may be of similar configurations and/or lengths, to create similar electrical paths. The electrical path may be created with similar or identical electrically conductive material. A similarity of electrical paths may permit simultaneous delivery, or closer to simultaneous delivery, of the reference signal to the first reference circuit and the second reference circuit. The reference signal may be a pulse, which is configured to trigger the reference circuits to output a reference entry or reference event.

The control circuit may be a microcontroller. The control circuit may be configured to transmit the reference signal at a predetermined interval. The frequency of the predetermined interval may be selected for a given implementation, but may be any frequency, without limitation. The frequency may be determined based on a volume of data to be gathered by any given implementation, and therefore may range from frequent to infrequent. The frequency of the control figure may be, without limitation, multiple times per second, every second, or greater than every second.

Each independent chip 202 and 203 may be configured as a System on Chip (SOC). A person skilled in the art will understand an SOC to be an integrated circuit that includes each component of its computer or electrical system, such as an embedded system. The independent chips 202 and 203 may be configured as redundant SOCs, such that the SOCs are independent chips for a single redundant purpose. This may be, for example, redundant independent chips for analyzing sensor data within an autonomous vehicle or a vehicle equipped with one or more Advanced Driver Assistance Systems. Such chips may be configured to receive vehicle sensor data and perform one or more processing tasks related to the received vehicle sensor data for the purpose of carrying out an autonomous driving action or an Advanced Driver Assistance Systems action.

Each SOC is configured to create an operations log, such that the plurality of operations logs are combined into a single multichip reference logging system. The multichip reference logging system includes a protocol of chip operations, such as logical operations, processor actions, processor heirs, etc. The multichip reference logging system may be used in a debugging operation to review or analyze processor actions, such as, but not limited to, assessing errors that occur within a processor.

The multichip reference logging system may include parallel entries from redundant SOCs, such as a first entry from the first SOC 202 and a second entry from the second SOC 203. Because the first SOC 202 and the second SOC 203 are functionally identical, it is anticipated that the parallel entries from the SOCs will be largely similar. However, distinctions between the parallel entries may arise for a variety of reasons, including, but not limited to, oscillator a synchronicity, changes in temperature, processor failure, chip failure, sensor failure, or otherwise. The multichip reference logging system may include a protocol of chip operations that may be used at least for debugging purposes.

The Advanced Driver Assistance System Logging Synchronization System 201 may include one or more ports for downloading and operations log of the first SOC, the second SOC, or a combined operations log of both SOCs. The port may be a universal serial bus port, a serial port, or any other type of input/output port which may permit connection between an external computing device, such as a laptop or desktop, and the Advanced Driver Assistance System Logging Synchronization System 201.

The operations log of the multichip reference logging system may include trace entries from the first SOC and the second SOC. The operations log may be configured to synchronize the trace entries from the first SOC and the second SOC by referencing a first reference event to a second reference event. The first reference event and second reference event are expected to be created simultaneously or nearly simultaneously, and they may be matched or cross-referenced within the operations log. By matching these simultaneously or near simultaneously created references within the operations log, the trace logs may be correlated for simplicity of reference in debugging operations. Although redundant SOCs may generally process the same sensor information, it is anticipated that the resulting trace logs from these two SOCs will remain different for a variety of reasons including, but not limited to, oscillator asynchronicity, temperature changes, faulty sensor data, air or frequency, component failure, etc. Where there are differences in the processing activities between the two SOCs, the resulting trace logs are expected to differ, which complicates debugging, as related entries from corresponding sensor information or corresponding processing actions are located within different portions of the log. The addition of simultaneously generated entries from reference circuits permits simplified alignment of debugging information.

According to another aspect of the disclosure, the ADAS system described herein may not be limited to a motor vehicle, such as a car, truck, tractor, etc., but may also be included in any other object that is configured to locomote. This may include airborne vehicles, such as airplanes, helicopters, unmanned aerial vehicles, etc. This may also include sea-based vehicles, such as boats, ships, submarines, etc. The ADAS system may be used in any object capable of location, in which redundant chips are installed.

In the following, various examples are provided with reference to the aspects described above.

In Example 1, a multichip reference logging system is disclosed, comprising a control circuit, configured to generate a reference signal; a first chip, configured to generate a first operations log, the first chip further comprising a first reference circuit, configured to receive the reference signal and to create a first reference event in response to the received reference signal; a memory associated with the first chip, configured to store the first reference event within the first operations log; a second chip, configured to generate a second operations log, the second chip further comprising a second reference circuit, configured to receive the reference signal and to create a second reference event in response to the received reference signal; and a memory associated with the second chip, configured to store the second reference event within the second operations log.

In Example 2, the multichip reference logging system of any one of Example 1 is disclosed, further comprising at least one input/output port connected to the first chip and at least one input/output port connected to the second chip is disclosed, wherein the first chip and the second chip are further configured to include activity from the input/output ports within the operations logs.

In Example 3, the multichip reference logging system of Example 1 or 2 is disclosed, wherein the control circuit is electrically connected to the first reference circuit and the second reference circuit.

In Example 4, the multichip reference logging system of Example 3 is disclosed, wherein the electrical connection is configured to synchronously deliver the reference signal to the first reference circuit and the second reference circuit.

In Example 5, the multichip reference logging system of any one of Examples 1 to 4 is disclosed, wherein the first chip and the second chip are configured as SOCs (System on Chip).

In Example 6, the multichip reference logging system of any one of Examples 1 to 5 is disclosed, wherein the first chip and the second chip are configured to receive vehicle sensor data.

In Example 7, the multichip reference logging system of any one of Examples 1 to 6 is disclosed, wherein the first chip and the second chip are configured to perform one or more autonomous driving operations.

In Example 8, the multichip reference logging system of any one of Examples 1 to 7 is disclosed, wherein the operations log comprises a protocol of chip operations for debugging.

In Example 9, the multichip reference logging system of any one of Examples 1 to 8 is disclosed, further comprising a port for downloading the operations log.

In Example 10, the multichip reference logging system of any one of Examples 1 to 9 is disclosed, wherein the first reference circuit and the second reference circuits are counters.

In Example 11, the multichip reference logging system of Example 10 is disclosed, wherein the counters are configured to output an incremented count upon receiving the reference signal.

In Example 12, the multichip reference logging system of Example 10 or 11 is disclosed, wherein the counters are synchronized and configured to output an identical number upon receiving the reference signal.

In Example 13, the multichip reference logging system of any one of Examples 1 to 12 is disclosed, wherein the reference signal is a pulse.

In Example 14, the multichip reference logging system of any one of Examples 1 to 13 is disclosed, wherein the reference signal is a command to generate a reference event.

In Example 15, the multichip reference logging system of any one of Examples 1 to 14 is disclosed, wherein the first reference event and the second reference event comprise an identical identifier.

In Example 16, the multichip reference logging system of any one of Examples 1 to 15 is disclosed, wherein the first reference event and the second reference event are signal events from the reference circuitry.

In Example 17, the multichip reference logging system of any one of Examples 1 to 16 is disclosed, wherein the first reference event and the second reference event comprise a number that is incremented in accordance with a reference signal.

In Example 18, the multichip reference logging system of any one of Examples 1 to 17 is disclosed, wherein the control circuit is a microcontroller.

In Example 19, the multichip reference logging system of any one of Examples 1 to 18 is disclosed, wherein the control circuit is configured to transmit the reference signal at a predetermined interval.

In Example 20, the multichip reference logging system of Example 19 is disclosed, wherein the predetermined interval is one reference signal per received trigger interval.

In Example 21, the multichip reference logging system of any one of Example 1 to 20 is disclosed, wherein the operations logs are configured to be synchronized by referencing the first reference event to the second reference event.

In Example 22, a method of multichip reference logging is disclosed comprising: generating a reference signal; receiving the reference signal and creating a first reference event and a second reference event in response to the received reference signal; storing the first reference event within a first operations log associated with a first chip; and storing the second reference event within a second operations log associated with a second chip.

In Example 23, the method of multichip reference logging of Example 22 is disclosed, further comprising receiving sensor data from at least one input/output port and logging receipt of the sensor data within the first operations log and the second operations log.

In Example 24, the method of multichip reference logging of Example 22 or 23 is disclosed, wherein the reference signal is electrically transmitted to the first reference circuit and the second reference circuit.

In Example 25, the method of multichip reference logging of any one of Examples 22 through 24 is disclosed, wherein the reference signal is synchronously transmitted to the first reference circuit and the second reference circuit.

In Example 26, the method of multichip reference logging of any one of Examples 22 to 25 is disclosed, wherein the first reference signal event and the second reference signal events are generated on SOCs (System on Chip).

In Example 27, the method of multichip reference logging of any one of Examples 22 to 26 is disclosed, further comprising receiving vehicle sensor data and storing receipt of the vehicle sensor data in the first operations log and the second operations log.

In Example 28, the method of multichip reference logging of any one of Examples 22 to 27 is disclosed, further comprising logging autonomous driving operations in the first operations log and the second operations log.

In Example 29, the method of multichip reference logging of any one of Examples 22 to 28 is disclosed, wherein the operations logs are tracing logs for debugging.

In Example 30, the method of multichip reference logging of any one of Examples 22 to 29 is disclosed, further comprising downloading the operations logs on an external device for debugging.

In Example 31, the method of multichip reference logging of any one of Examples 22 to 30 is disclosed, wherein the first signal event is received by the reference circuit.

In Example 32, the method of multichip reference logging of any one of Examples 22 to 31 is disclosed, wherein the first reference event and the second reference event are signal events from the reference circuitry.

In Example 33, the method of multichip reference logging of Example 32 is disclosed, wherein the counters are configured to output an incremented count upon receiving the reference signal.

In Example 34, the method of multichip reference logging of Example 32 or 33 is disclosed, wherein the counters are synchronized and configured to output an identical number upon receiving the reference signal.

In Example 35, the method of multichip reference logging of any one of Examples 22 to 34 is disclosed, wherein the reference signal is a pulse.

In Example 36, the method of multichip reference logging of any one of Examples 22 to 35 is disclosed, wherein the reference signal is a command to generate a reference event.

In Example 37, the method of multichip reference logging of any one of Examples 22 to 36 is disclosed, wherein the first reference event and the second reference event comprise an identical identifier.

In Example 38, the method of multichip reference logging of any one of Examples 22 to 37 is disclosed, wherein the first reference event and the second reference event are signal events from the reference circuitry.

In Example 39, the method of multichip reference logging of any one of Examples 22 to 38 is disclosed, wherein the first reference event and the second reference event comprise a number that is incremented in accordance with a reference signal.

In Example 40, the method of multichip reference logging of any one of Examples 22 to 39 is disclosed, wherein the reference signal is generated by a microcontroller.

In Example 41, the method of multichip reference logging of any one of Examples 22 to 40 is disclosed, wherein the reference signal is generated at a predetermined interval.

In Example 42, the method of multichip reference logging of Example 41 is disclosed, wherein the predetermined interval is one reference signal per received trigger interval.

In Example 43, the method of multichip reference logging of any one of Example 22 to 42 is disclosed, wherein the operations logs are configured to be synchronized by referencing the first reference event to the second reference event.

In Example 44, a means for multisystem processor reference logging is disclosed comprising a control means, configured to generate a reference signal; a first system processing means, configured to generate a first operations log, the first system processing means further comprising: a first reference generation means, configured to receive the reference signal and to create a first reference event in response to the received reference signal; a storage means associated with the first system processing means, configured to store the first reference event within the first operations log; a second system processing means, configured to generate a second operations log, the second system processing means further comprising: a second reference generation means, configured to receive the reference signal and to create a second reference event in response to the received reference signal; and a storage means associated with the second system processing means, configured to store the second reference event within the second operations log.

In Example 45, the means for multisystem processor reference logging of any one of Example 44 is disclosed, further comprising at least one input/output exchange means connected to the first system processing means and at least one input/output exchange means connected to the second system processing means is disclosed, wherein the first system processing means and the second system processing means are further configured to include activity from the input/output means within the operations logs.

In Example 46, the means for multisystem processor reference logging of Example 44 or 45 is disclosed, wherein the control means is electrically connected to the first reference generation means and the second reference generation means.

In Example 47, the means for multisystem processor reference logging of Example 46 is disclosed, wherein the electrical connection is configured to synchronously deliver the reference signal to the first reference generation means and the second reference generation means.

In Example 48, the means for multisystem processor reference logging of any one of Examples 44 to 47 is disclosed, wherein the first system processing means and the second system processing means are configured as SOCs (System on System processing means).

In Example 49, the means for multisystem processor reference logging of any one of Examples 44 to 48 is disclosed, wherein the first system processing means and the second system processing means are configured to receive vehicle sensor data.

In Example 50, the means for multisystem processor reference logging of any one of Examples 44 to 49 is disclosed, wherein the first system processing means and the second system processing means are configured to perform one or more autonomous driving operations.

In Example 51, the means for multisystem processor reference logging of any one of Examples 44 to 50 is disclosed, wherein the operations log comprises a protocol of system processing means operations for debugging.

In Example 52, the means for multisystem processor reference logging of any one of Examples 44 to 51 is disclosed, further comprising a port for downloading the operations log.

In Example 53, the means for multisystem processor reference logging of any one of Examples 44 to 52 is disclosed, wherein the first reference generation means and the second reference generation means are counters.

In Example 54, the means for multisystem processor reference logging of Example 53 is disclosed, wherein the counters are configured to output an incremented count upon receiving the reference signal.

In Example 55, the means for multisystem processor reference logging of Example 53 or 54 is disclosed, wherein the counters are synchronized and configured to output an identical number upon receiving the reference signal.

In Example 56, the means for multisystem processor reference logging of any one of Examples 44 to 55 is disclosed, wherein the reference signal is a pulse.

In Example 57, the means for multisystem processor reference logging of any one of Examples 44 to 55 is disclosed, wherein the reference signal is a command to generate a reference event.

In Example 58, the means for multisystem processor reference logging of any one of Examples 44 to 57 is disclosed, wherein the first reference event and the second reference event comprise an identical identifier.

In Example 59, the means for multisystem processor reference logging of any one of Examples 44 to 58 is disclosed, wherein the first reference event and the second reference event are signal events from the reference circuitry.

In Example 60, the means for multisystem processor reference logging of any one of Examples 44 to 59 is disclosed, wherein the first reference event and the second reference event comprise a number that is incremented in accordance with a reference signal.

In Example 61, the means for multisystem processor reference logging of any one of Examples 44 to 60 is disclosed, wherein the control means is a microcontroller.

In Example 62, the means for multisystem processor reference logging of any one of Examples 44 to 61 is disclosed, wherein the control means is configured to transmit the reference signal at a predetermined interval.

In Example 63, the means for multisystem processor reference logging of Example 62 is disclosed, wherein the predetermined interval is one reference signal per received trigger interval.

In Example 64, the means for multisystem processor reference logging of any one of Example 1 to 63 is disclosed, wherein the operations logs are configured to be synchronized by referencing the first reference event to the second reference event.

In Example 65, a non-transient computer readable medium configured to carry out the method of any one of Examples 22 through 43 is disclosed.

In Example 66, a non-transient computer-readable medium configured to perform the method of any one of Examples 22 to 43.

While the multichip reference logging system has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A multichip reference logging system comprising:
    a control circuit, configured to generate a reference signal;
    a first chip, configured to generate a first operations log, the first chip further comprising:
    a first reference circuit, configured to receive the reference signal and to create a first reference event in response to the received reference signal;
    a memory associated with the first chip, configured to store the first reference event within the first operations log;
    a second chip, configured to generate a second operations log, the second chip further comprising:
    a second reference circuit, configured to receive the reference signal and to create a second reference event in response to the received reference signal; and
    a memory associated with the second chip, configured to store the second reference event within the second operations log;
    wherein each of the first reference circuit and the second reference circuit comprise a counter; wherein the counters are configured to output an incremented count in response to receiving the reference signal; and wherein the first chip is further configured to include the incremented count in the first operations log, and wherein the second chip is further configured to include the incremented count in the second operations log.

2. The multichip reference logging system of claim 1, further comprising at least one input/output port connected to the first chip and at least one input/output port connected to the second chip, wherein the first chip and the second chip are further configured to include activity from the input/output ports within the operations logs.

3. The multichip reference logging system of claim 1, wherein the control circuit is electrically connected to the first reference circuit and the second reference circuit.

4. The multichip reference logging system of claim 3, wherein the electrical connection is configured to synchronously deliver the reference signal to the first reference circuit and the second reference circuit.

5. The multichip reference logging system of claim 1, wherein the first chip and the second chip are configured to receive vehicle sensor data.

6. The multichip reference logging system of claim 1, wherein the first chip and the second chip are configured to perform one or more autonomous driving operations.

7. The multichip reference logging system of claim 1, wherein the operations log comprises a protocol of chip operations for debugging.

8. The multichip reference logging system of claim 1, wherein the control circuit is configured to generate a reference signal at a predetermined interval.

9. The multichip reference logging system of claim 8, wherein the predetermined interval is less frequent than a clock signal speed of the control circuit.

10. The multichip reference logging system of claim 1, wherein the counters are synchronized and configured to output an identical number upon receiving the reference signal.

11. The multichip reference logging system of claim 1, wherein the reference signal is a pulse.

12. The multichip reference logging system of claim 1, wherein the control circuit is configured to transmit the reference signal at a predetermined interval.

13. A method of multichip reference logging comprising:
    generating a reference signal;
    receiving the reference signal and creating a first reference event and a second reference event in response to the received reference signal, in which the first reference event and the second reference event comprise incremented counts of at least one counter;
    storing the first reference event within a first operations log associated with a first chip; and
    storing the second reference event within a second operations log associated with a second chip.

14. The method of multichip reference logging of claim 13, further comprising receiving sensor data from at least one input/output port and logging receipt of the sensor data within the first operations log and the second operations log.

15. The method of multichip reference logging of claim 13, wherein the reference signal is synchronously transmitted to the first reference circuit and the second reference circuit.

16. The method of multichip reference logging of claim 13, further comprising outputting an incremented count upon receiving the reference signal.

17. The method of multichip reference logging of claim 13, further comprising outputting identical synchronized numbers upon receiving the reference signal.

18. The method of multichip reference logging of claim 17, wherein the reference signal is a command to generate a reference event.

19. A means for multi system processor reference logging comprising:
    a control means, configured to generate a reference signal;
    a first system processing means, configured to generate a first operations log, the first system processing means further comprising:

a first reference generation means, configured to receive the reference signal and to create a first reference event in response to the received reference signal;

a storage means associated with the first system processing means, configured to store the first reference event within the first operations log;

a second system processing means, configured to generate a second operations log, the second system processing means further comprising:

a second reference generation means, configured to receive the reference signal and to create a second reference event in response to the received reference signal; and a storage means associated with the second system processing means, configured to store the second reference event within the second operations log;

wherein each of the first reference generation means and the second reference generation means comprise a counter; wherein the counters are configured to output an incremented count in response to receiving the reference signal; and wherein the first system processing means is further configured to include the incremented count in the first operations log, and wherein the second system processing means is further configured to include the incremented count in the second operations log.

20. The means for multisystem processor reference logging of claim 19, further comprising at least one input/output exchange means connected to the first system processing means and at least one input/output exchange means connected to the second system processing means, wherein the first system processing means and the second system processing means are further configured to include activity from the input/output means within the operations logs.

* * * * *